US009326399B2

(12) United States Patent
Stringer et al.

(10) Patent No.: US 9,326,399 B2
(45) Date of Patent: Apr. 26, 2016

(54) ELECTRICAL SYSTEM AND SENSOR ATTACHMENT ASSEMBLY AND METHOD THEREFOR

(71) Applicant: Eaton Corporation, Cleveland, OH (US)

(72) Inventors: Jeffrey Thomas Stringer, Pittsburgh, PA (US); John Puskar-Pasewicz, Pittsburgh, PA (US); Bryan Kroh, Pittsburgh, PA (US); Rufus Barnes, Cranberry Township, PA (US); Adam N. Troup, Pittsburgh, PA (US)

(73) Assignee: EATON CORPORATION, Cleveland, OH (US)

( * ) Notice: Subject to any disclaimer, the term of this patent is extended or adjusted under 35 U.S.C. 154(b) by 71 days.

(21) Appl. No.: 14/221,910

(22) Filed: Mar. 21, 2014

(65) Prior Publication Data

US 2015/0271936 A1    Sep. 24, 2015

(51) Int. Cl.
*H05K 7/00* (2006.01)
*H05K 5/02* (2006.01)
*H02G 1/00* (2006.01)
*H02G 5/02* (2006.01)
*H05K 5/00* (2006.01)
*G01R 1/04* (2006.01)
*G01D 11/24* (2006.01)
*G01R 15/20* (2006.01)
*G01R 31/12* (2006.01)

(52) U.S. Cl.
CPC ............ *H05K 5/0221* (2013.01); *G01D 11/245* (2013.01); *G01R 1/04* (2013.01); *G01R 15/207* (2013.01); *G01R 31/1209* (2013.01); *H02G 1/00* (2013.01); *H02G 5/025* (2013.01); *H05K 5/0091* (2013.01); *Y10T 29/49169* (2015.01)

(58) Field of Classification Search
CPC .................... E05F 15/431; G05B 2219/39529; G05B 2219/40599
USPC .......................... 361/728–730, 807, 809, 810
See application file for complete search history.

(56) References Cited

U.S. PATENT DOCUMENTS

| 4,425,921 | A | * | 1/1984 | Fujisaki et al. ............... | 600/503 |
| 5,426,360 | A | | 6/1995 | Maraio et al. | |
| 5,792,947 | A | | 8/1998 | Pogrebinsky et al. | |
| 5,810,736 | A | * | 9/1998 | Pail .............................. | 600/500 |

(Continued)

FOREIGN PATENT DOCUMENTS

| DE | 26 41 047 A1 | 3/1978 |
| DE | 198 11 366 A1 | 9/1999 |
| FR | 1 181 357 A | 6/1959 |

OTHER PUBLICATIONS

European Patent Office, "International Search Report and Written Opinion", PCT/US2015/016007, May 20, 2015, 11 pp.

*Primary Examiner* — Hung S Bui
(74) *Attorney, Agent, or Firm* — Eckert Seamans Cherin & Mellott, LLC; Grant E. Coffield

(57) ABSTRACT

A sensor attachment assembly for an electrical system includes a sensor housing at least partially enclosing a sensor, and a fastening member coupled to the sensor housing and being structured to extend from one portion of the sensor housing, around a corresponding electrical conductor of the electrical system and attach to another portion of the sensor housing, in order to removably attach the sensor to the electrical conductor.

5 Claims, 3 Drawing Sheets

(56) References Cited

U.S. PATENT DOCUMENTS

| | | | |
|---|---|---|---|
| 5,933,575 A * | 8/1999 | Sanders | 392/501 |
| 6,333,715 B1 | 12/2001 | Kato et al. | |
| 6,518,772 B1 | 2/2003 | Milkovic et al. | |
| 7,148,696 B2 | 12/2006 | Zhou et al. | |
| 7,403,129 B2 | 7/2008 | Zhou et al. | |
| 7,411,403 B2 | 8/2008 | Zhou | |
| 7,746,055 B2 | 6/2010 | Bose et al. | |
| 7,789,679 B2 * | 9/2010 | Wu et al. | 439/135 |
| 8,665,666 B2 | 3/2014 | Zhou et al. | |
| 8,827,906 B2 * | 9/2014 | Yuen et al. | 600/301 |
| 2003/0017753 A1 | 1/2003 | Palmisano et al. | |
| 2009/0141433 A1* | 6/2009 | Maloney et al. | 361/679.01 |
| 2009/0163322 A1* | 6/2009 | Andren et al. | 482/8 |
| 2010/0013457 A1 | 1/2010 | Nero, Jr. | |
| 2012/0092020 A1 | 4/2012 | Zhou et al. | |
| 2014/0206963 A1* | 7/2014 | Al-Ali | 600/323 |

* cited by examiner

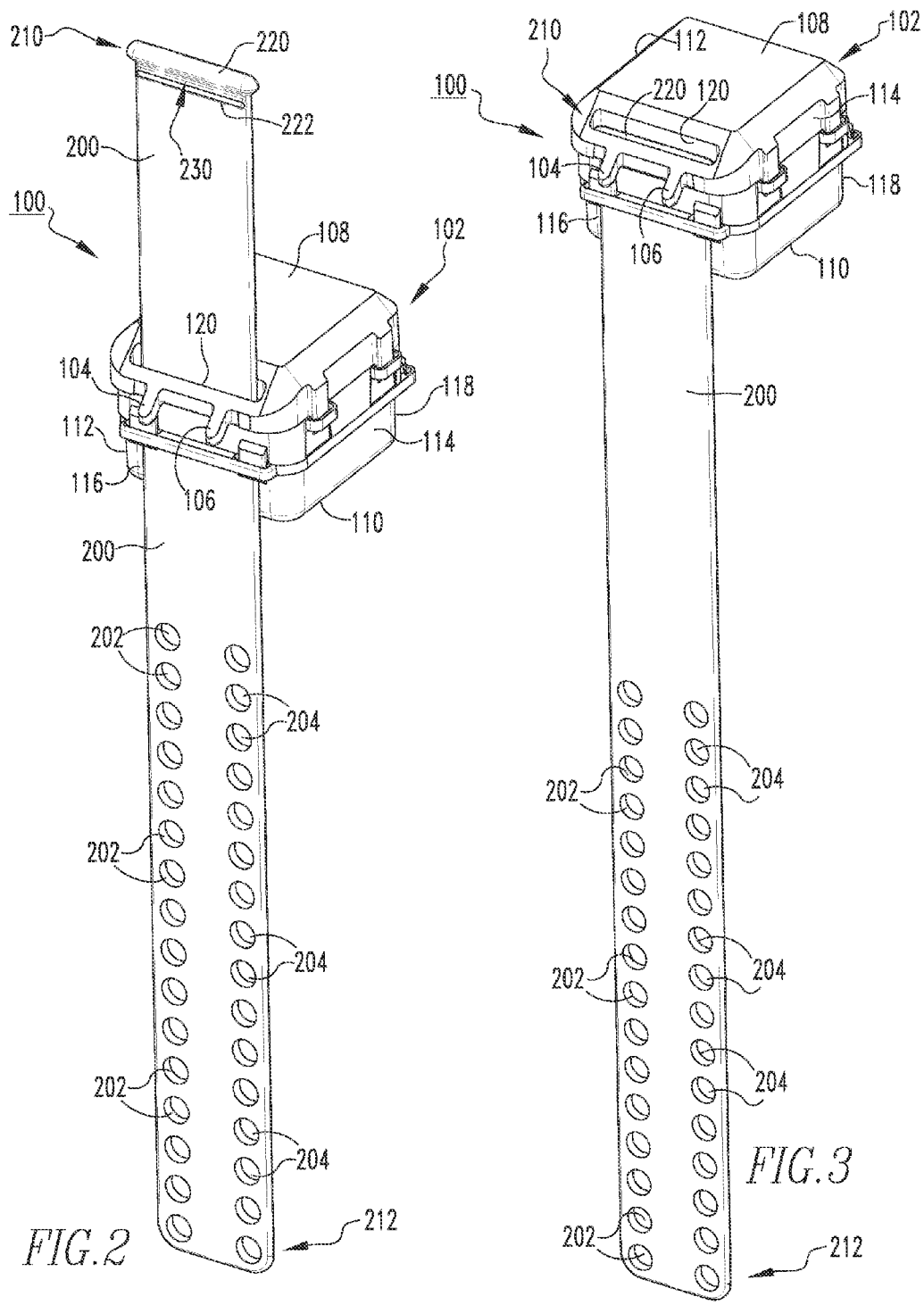

ELECTRICAL SYSTEM AND SENSOR ATTACHMENT ASSEMBLY AND METHOD THEREFOR

BACKGROUND

1. Field

The disclosed concept relates generally to electrical systems and, more particularly, to electrical systems employing a number of sensors. The disclosed concept also relates to sensor attachment assemblies for electrical systems. The disclosed concept further relates to sensor attachment methods.

2. Background Information

Electrical systems often include a plurality of bus bars, and various electrical apparatus, such as electrical switching apparatus (e.g., without limitation, circuit breakers), mechanically coupled and electrically connected to the bus bars.

Some electrical systems employ sensors attached directly to the bus bars, in order to monitor various conditions within the electrical system. In low or medium voltage electrical systems, for example, attachment of such sensors to the bus bars is subject to a variety of issues or problems. It is desirable to provide for relatively quick and easy attachment of the sensors in new system applications, as well as to allow for retro-fit applications. Among other additional considerations are minimizing complexity and cost, ease of assembly and manufacture of the attachment assembly, and avoiding the attachment assembly coming loose, for example during shipment or installation. The sensor and attachment assembly must also be capable of safe and effective operation in relatively high temperatures (e.g., up to 135 degrees Celsius or more bus bar temperatures) environments.

There is, therefore, room for improvement electrical systems, and in sensor attachment assemblies and methods therefor.

SUMMARY

These needs and others are met by embodiments of the disclosed concept, which are directed to an attachment assembly and method for attaching sensors in electrical systems.

As one aspect of the disclosed concept a sensor attachment assembly is provided for an electrical system. The electrical system comprises a sensor and a number of electrical conductors. The sensor attachment assembly comprises: a sensor housing structured to at least partially enclose the sensor; and a fastening member coupled to the sensor housing and being structured to extend from one portion of the sensor housing around a corresponding one of the electrical conductors and attach to another portion of the sensor housing, in order to removably attach the sensor to the corresponding one of the electrical conductors.

The fastening member may be an elongated strap, and the corresponding electrical conductor may be a bus bar. The elongated strap may be structured to wrap around the bus bar and attach to the sensor housing. The elongated strap may be adjustable among a plurality of predetermined positions with respect to the sensor housing. The elongated strap may comprise a plurality of holes, and the sensor housing may comprise a number of protrusions each being structured to be disposed in a corresponding one of the holes to removably secure the elongated strap in a desired one of the predetermined positions.

The sensor housing may further comprise a top, a bottom disposed opposite the top, a first side, a second side disposed opposite the first side, a first end, a second end disposed opposite the first end, and a slot disposed at or about the first end. The bottom may be structured to engage the bus bar. The elongated strap may be structured to extend through the slot, around the bus bar, and over the top of the sensor housing.

The elongated strap may include a first end and a second end disposed opposite and distal from the first end, wherein the first end of the elongated strap includes an enlarged lip portion. The enlarged lip portion may be structured to engage the sensor housing at or about the slot to prevent the elongated strap from undesirably detaching from the sensor housing. The elongated strap may further include a rib disposed proximate to but spaced a predetermined distance from the enlarged lip portion, wherein the rib and enlarged lip portion are structured to cooperate with the sensor housing to maintain the elongated strap in a desired position with respect to the sensor housing.

As another aspect of the disclosed concept, an electrical system comprises: a number of electrical conductors; a number of sensors; and at least one sensor attachment assembly comprising: a sensor housing at least partially enclosing a corresponding one of the sensor, and a fastening member coupled to the sensor housing and extending from one portion of the sensor housing around a corresponding one of the electrical conductors and attaching to another portion of the sensor housing, in order to removably attach the corresponding one of the sensors to the corresponding one of the electrical conductors.

As a further aspect of the disclosed concept, a method of attaching a sensor to an electrical conductor comprises the steps of: providing a sensor housing at least partially enclosing the sensor, coupling a fastening member to a portion of the sensor housing, wrapping the fastening member around the electrical conductor, and attaching the fastening member to another portion of the sensor housing, in order to removably attach the sensor to the electrical conductor.

The fastening member may be an elongated strap, and the corresponding one of the electrical conductors may be a bus bar. The wrapping step may further comprise wrapping the elongated strap around the bus bar, and the attaching step may further comprise attaching the elongated strap to the sensor housing. The method may further comprise cutting the elongated strap to a desired length.

BRIEF DESCRIPTION OF THE DRAWINGS

A full understanding of the disclosed concept can be gained from the following description of the preferred embodiments when read in conjunction with the accompanying drawings in which:

FIGS. 2 and 3 are a isometric views of the sensor attachment assembly of FIG. 1;

DESCRIPTION OF THE PREFERRED EMBODIMENTS

For purposes of illustration of one non-limiting example embodiment of the disclosed concept, the disclosed sensor attachment assembly is described herein with respect to the attachment of acoustic sensors to the electrical bus bars of a low to medium voltage electrical system. Such acoustic sensors are described, for example and without limitation, in commonly assigned U.S. Pat. No. 8,665,666 and U.S. Patent Application Publication No. 2012/0092020, which are hereby incorporated by reference as if fully set forth herein. It will be appreciated, however, that the disclosed sensor attachment assembly could be used in a wide variety of alternative electrical systems for the suitable attachment of any known or suitable type and/or configuration of sensor or other electrical apparatus to a bus bar or other suitable electrical conductor.

As employed herein, the term "fastener" refers to any suitable separate connecting or tightening mechanism or components expressly including, but not limited to rivets, screws, bolts and the combinations of bolts and nuts (e.g., without limitation, lock nuts) and bolts, washers and nuts.

As employed herein, the statement that two or more parts are "coupled" together shall mean that the parts are joined together either directly or joined through one or more intermediate parts.

As employed herein, the statement that two or more parts are "attached" shall mean that the parts are directly joined together, without any intermediate parts.

As employed herein, the term "number" shall mean one or an integer greater than one (i.e., a plurality).

Figure 1:
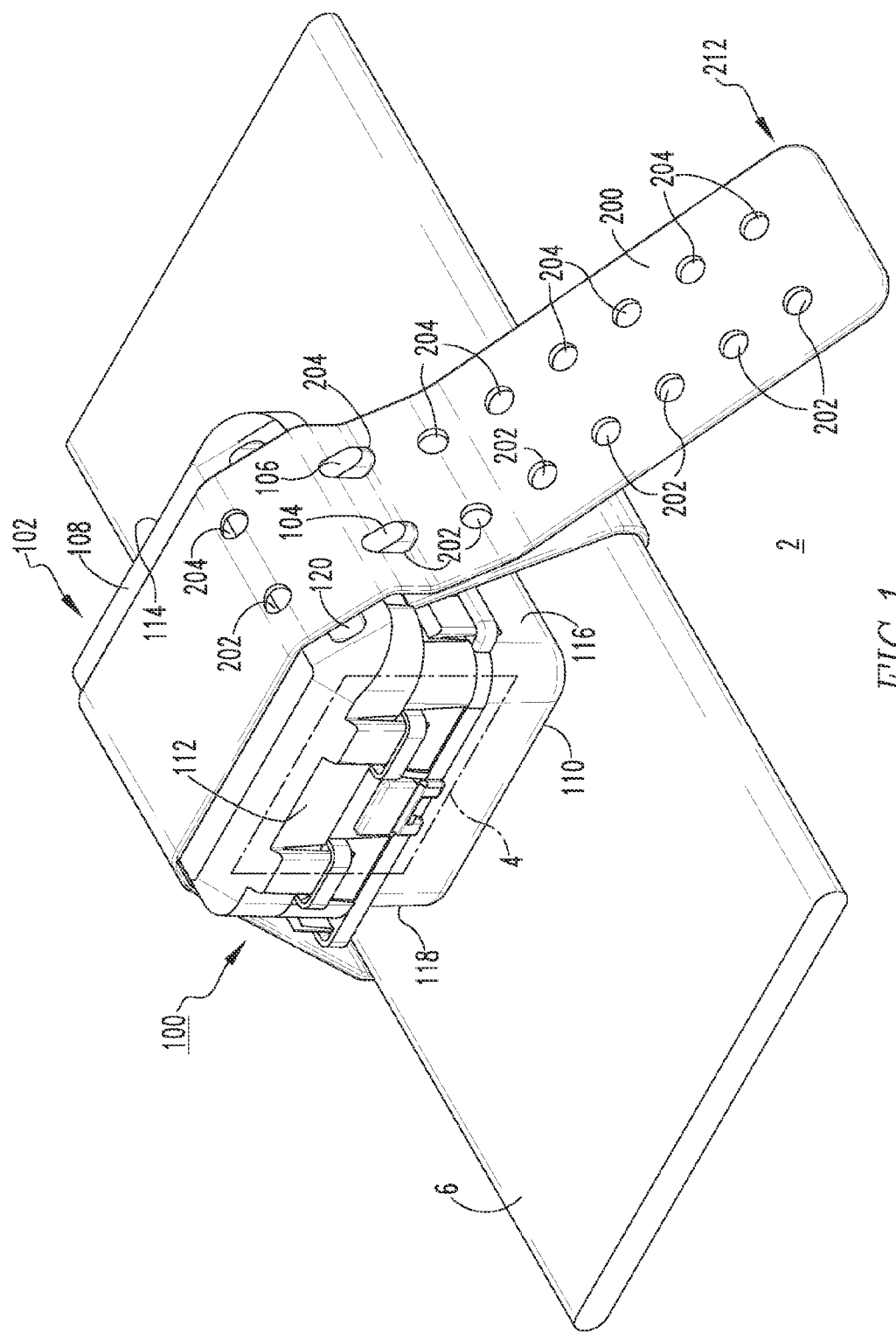
FIG. 1 an isometric view of a portion of an electrical system and sensor attachment assembly therefor, in accordance with an embodiment of the disclosed concept.

FIG. 1 shows a sensor attachment assembly 100 for an electrical system 2 (partially shown), in accordance with one non-limiting example embodiment of the disclosed concept. The electrical system 2 includes a sensor 4 (partially shown in simplified form in phantom line drawing in FIG. 1), and a number of electrical conductors such as, for example and without limitation, the single bus bar 6, shown.

Figure 4:
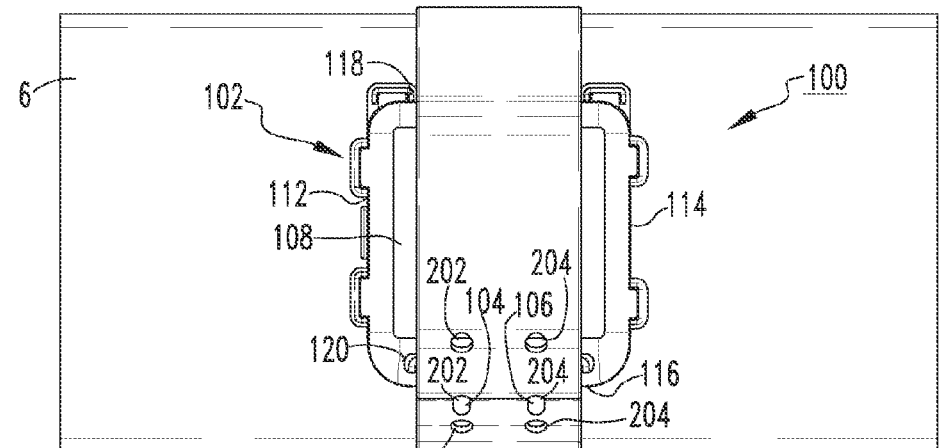
FIG. 4 is a top plan view of the portion of the electrical system and sensor attachment assembly therefor of FIG. 1.
Figure 5:
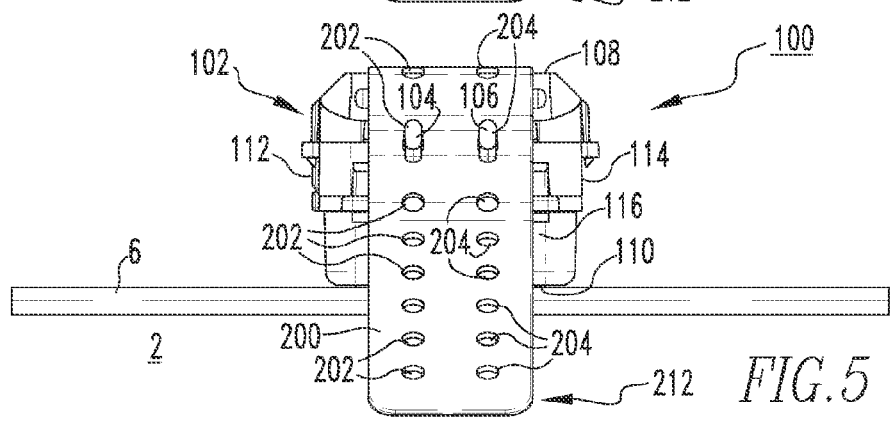
FIG. 5 is a side elevation view of the portion of the electrical system and sensor attachment assembly therefor of FIG. 4.

The sensor attachment assembly 100 includes a sensor housing 102 structured to at least partially enclose the sensor 4 (FIG. 1), and a fastening member 200 coupled to the sensor housing 102. The example fastening member is an elongated strap 200, which is structured to extend from one portion of the sensor housing 102 around the corresponding electrical conductor (e.g., without limitation, bus bar 6 (partially shown)), and to attach to another portion of the sensor housing 102, in order to removably attach the sensor 4 to the bus bar 6. In other words, the elongated strap 200 wraps around the bus bar 6 and reattaches to the sensor housing 102, as shown in FIG. 1 (see also FIGS. 4-6).

The elongated strap 200 is adjustable among the plurality of predetermined positions with respect to the sensor housing 102. Such adjustability is provided, for example and without limitation, by way of a plurality of holes 202,204 disposed in the elongated strap 200, as shown. The sensor housing 102 includes a number of corresponding protrusions, adapted to cooperate with the holes 202,204. In the example shown, the protrusions are a pair of pegs 104,106. Each peg 104,106 is structured to extend into and be disposed within a corresponding one of the holes 202,204 to removably secure the elongated strap 200 in a desired one of the predetermined positions. More specifically, the plurality of holes preferably comprises two parallel rows of holes 202,204 extending along the length of the elongated strap 200, as shown. The pegs 104,106 extend outwardly from the sensor housing 102, and are disposed within a desired pair of parallel holes 202, 204 (see, for example, FIGS. 1 and 4-6). In this manner, the sensor attachment assembly 100 can accommodate, for example, different widths and/or depths of bus bars (e.g., 6) or other suitable electrical conductors (not shown). It will, however, be appreciated that any known or suitable alternative number, type and/or configuration (not shown) of protrusions and holes other than the pair of pegs 104,106 and parallel rows of holes 202,204 could be employed, without departing from the scope of the disclosed concept.

In the example shown and described herein, the sensor housing 102 includes a top 108, a bottom 110 disposed opposite the top 108, a first side 112, a second side 114 disposed opposite the first 112, a first end 116, and a second end 118 disposed opposite the first end 116. The pegs 104,106 are shown extending outwardly from the first end 116 of the sensor housing 102. It will be appreciated, however, that the pegs 104,106 could alternatively be located on the top 108 of the sensor housing 102, or in any other known or suitable location (not shown).

Referring to FIGS. 2 and 3, the first end 116 of the sensor housing 102 also includes a slot 120. The example elongated strap 200 includes a first end 210 and second end 212 disposed opposite and distal from the first end 210. The first end 210 has an enlarged lip portion 220, as shown. The enlarged lip portion 220 is structured to engage the sensor housing 102 at or about the slot 120 to prevent the elongated strap 200 from undesirably detaching from the sensor housing 102. That is, the first end 212 of the elongated strap 200 is inserted through the slot 120 and the strap 200 is adjusted with respect to the sensor housing 102 until it is in the final position, shown in FIG. 3.

The elongated strap 200 preferably further includes a rib 222, which is disposed proximate to but spaced a predetermined distance 230 from the enlarged lip portion 220, as best shown in FIG. 2. The rib 222 and enlarged lip portion 220 are structured to cooperate with the sensor housing 102 to maintain the elongated strap 200 in a desired position with respect to the sensor housing 102.

Stated another way, the enlarged lip portion 220 serves to keep the elongated strap 200 from detaching from the sensor housing 102 in the pull-through direction, while the rib 222, in combination with the enlarged lip portion 220 (and space 230 therebetween), serves to keep the elongated strap 200 from detaching from the sensor housing 102, or undesirably sliding in the opposite direction. The rib 222, therefore, keeps the elongated strap 200 from becoming loose, for example and without limitation, in shipment and/or during installation.

Figure 6:
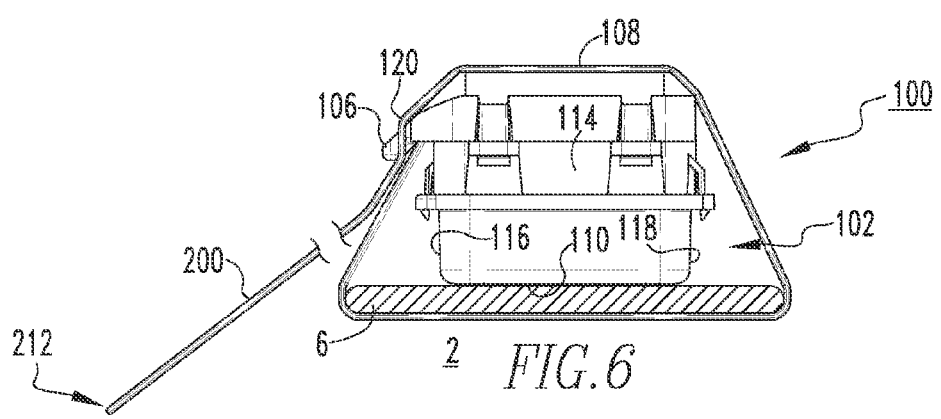
FIG. 6 is an end elevation, partially in section view of the portion of the electrical system and sensor attachment assembly therefor of FIG. 5.

The elongated strap 200 is preferably made from a resilient material such as, for example and without limitation, silicone rubber. Such material allows for relatively quick and easy installation since the silicone rubber simply stretches around the bus bar 6 onto the sensor housing 102. The design also allows for retro-fit applications, and ease of assembly and manufacture of the sensor attachment assembly 100. The resilient nature of the elongated strap 200, in combination with the aforementioned adjustability thereof, also serves to ensure the secure attachment of the sensor 4 (FIG. 1) to bus bar 6, as shown in FIGS. 1 and 4-6. That is, in operation, the elongated strap 200 wraps around the bus bar 6 and attaches to the sensor housing 102, as best shown in FIG. 6. More specifically, the bottom 110 of the sensor housing 102 is structured to engage the bus bar 6, and the elongated strap 200 is structured to extend through the aforementioned slot 120 in the sensor housing 102, around the bus bar 6, and over the top 108 of the sensor housing 102. The elongated strap 200 is then fastened to the sensor housing 102 using the aforementioned pegs 104,106 within corresponding holes 202,204 of the elongated strap 200. As also shown in FIG. 6, once the elongated strap 200 has been suitably adjusted to secure the sensor attachment assembly 100 to the bus bar 6, as desired, the elongated strap 200 can optionally be cut to the desired length. That is, the elongated strap 200 can be cut and any excess length can be removed.

Among other benefits, the sensor attachment assembly 100 is suitable for use in relatively high temperature environments (e.g., without limitation, 135 degrees C. bus bar temperatures; 65 degrees C. ambient), and no modification of the bus bar 6 or other electrical conductor (not shown) is required. For example and without limitation, it is not necessary to drill any holes in the bus bar 6 or make any other modifications in order to attach the sensor 4 (FIG. 1) using the sensor attachment assembly 100, in accordance with the disclosed concept. The adjustable resilient elongated strap 200 of the sensor attachment assembly also advantageously securely attaches the sensor (e.g., 4), without requiring the use of any separate fasteners.

Accordingly, it will be appreciated that the disclosed sensor attachment assembly 100 provides for a relatively low-profile design for relatively easily and quickly securely attaching a sensor 4 (FIG. 1) to a wide variety of different corresponding electrical conductors (e.g., without limitation, bus bar 6).

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A sensor attachment assembly for an electrical system, said electrical system comprising a sensor and a number of electrical conductors, said sensor attachment assembly comprising:
   a sensor housing structured to at least partially enclose said sensor; and
   a fastening member coupled to the sensor housing and being structured to extend from one portion of the sensor housing around a corresponding one of said electrical conductors and attach to another portion of the sensor housing, in order to removably attach said sensor to said corresponding one of said electrical conductors,
   wherein said fastening member is an elongated strap; wherein said corresponding one of said electrical conductors is a bus bar; and wherein said elongated strap is structured to wrap around said bus bar and attach to the sensor housing,
   wherein said elongated strap is adjustable among a plurality of predetermined positions with respect to the sensor housing; wherein said elongated strap comprises a plurality of holes; and wherein the sensor housing comprises a number of protrusions each being structured to be disposed in a corresponding one of said holes to removably secure said elongated strap in a desired one of said predetermined positions,
   wherein said plurality of holes comprises two parallel rows of holes in said elongated strap; and wherein said number of protrusions is a pair of pegs extending outwardly from the sensor housing,
   wherein the sensor housing further comprises a top, a bottom disposed opposite the top, a first side, a second side disposed opposite the first side, a first end, a second end disposed opposite the first end, and a slot disposed at or about the first end; wherein the bottom is structured to engage said bus bar; and wherein said elongated strap is structured to extend through said slot, around said bus bar, and over the top of the sensor housing, and
   wherein said pair of pegs extends outwardly from the first end of the sensor housing proximate to said slot.

2. The sensor attachment assembly of claim 1 wherein said elongated strap is made from silicone rubber.

3. A sensor attachment assembly for an electrical system, said electrical system comprising a sensor and a number of electrical conductors, said sensor attachment assembly comprising:
   a sensor housing structured to at least partially enclose said sensor; and
   a fastening member coupled to the sensor housing and being structured to extend from one portion of the sensor housing around a corresponding one of said electrical conductors and attach to another portion of the sensor housing, in order to removably attach said sensor to said corresponding one of said electrical conductors,
   wherein said fastening member is an elongated strap; wherein said corresponding one of said electrical conductors is a bus bar; and wherein said elongated strap is structured to wrap around said bus bar and attach to the sensor housing,
   wherein said elongated strap is adjustable among a plurality of predetermined positions with respect to the sensor housing; wherein said elongated strap comprises a plurality of holes; and wherein the sensor housing comprises a number of protrusions each being structured to be disposed in a corresponding one of said holes to removably secure said elongated strap in a desired one of said predetermined positions,
   wherein said plurality of holes comprises two parallel rows of holes in said elongated strap; and wherein said number of protrusions is a pair of pegs extending outwardly from the sensor housing,
   wherein the sensor housing further comprises a top, a bottom disposed opposite the top, a first side, a second side disposed opposite the first side, a first end, a second end disposed opposite the first end, and a slot disposed at or about the first end; wherein the bottom is structured to engage said bus bar; and wherein said elongated strap is structured to extend through said slot, around said bus bar, and over the top of the sensor housing,
   wherein said elongated strap includes a first end and a second end disposed opposite and distal from the first end; wherein the first end of said elongated strap includes an enlarged lip portion; and wherein said enlarged lip portion is structured to engage the sensor housing at or about said slot to prevent said elongated strap from undesirably detaching from the sensor housing, and
   wherein said elongated strap further includes a rib disposed proximate to but spaced a predetermined distance from said enlarged lip portion; and wherein said rib and said enlarged lip portion are structured to cooperate with the sensor housing to maintain said elongated strap in a desired position with respect to the sensor housing.

4. An electrical system comprising:
   a number of electrical conductors;
   a number of sensors; and
   at least one sensor attachment assembly comprising:
      a sensor housing at least partially enclosing a corresponding one of said sensor, and
      a fastening member coupled to the sensor housing and extending from one portion of the sensor housing around a corresponding one of said electrical conductors and attaching to another portion of the sensor housing, in order to removably attach said corresponding one of said sensors to said corresponding one of said electrical conductors, wherein said fastening member is an elongated strap; wherein said corresponding one of said electrical conductors is a bus bar; and wherein said elongated strap wraps around said bus bar and attaches to the sensor housing, wherein said elongated strap is adjustable among a plurality of predetermined positions with respect to the sensor housing; wherein said elongated strap comprises a plurality of holes; and wherein the sensor housing comprises a number of protrusions each being structured to be disposed in a corresponding one of said holes to removably secure said elongated strap in a desired one of said predetermined positions, wherein said plurality of holes comprises two parallel rows of holes in said elongated strap; and wherein said number of protrusions is a pair of pegs extending outwardly from the sensor housing, wherein the sensor housing further comprises a top, a bottom disposed opposite the top, a first side, a second side disposed opposite the first side, a first end, a second end disposed opposite the first end, and a slot disposed at or about the first end; wherein the bottom engages said bus bar; and wherein said elongated strap extends through said slot, around said bus bar, and over the top of the sensor housing, and wherein said pair of pegs extends outwardly from the first end of the sensor housing proximate to said slot.

5. An electrical system comprising:
a number of electrical conductors;
a number of sensors; and
at least one sensor attachment assembly comprising:
   a sensor housing at least partially enclosing a corresponding one of said sensor, and
   a fastening member coupled to the sensor housing and extending from one portion of the sensor housing around a corresponding one of said electrical conductors and attaching to another portion of the sensor housing, in order to removably attach said corresponding one of said sensors to said corresponding one of said electrical conductors, wherein said fastening member is an elongated strap; wherein said corresponding one of said electrical conductors is a bus bar; and wherein said elongated strap wraps around said bus bar and attaches to the sensor housing, wherein said elongated strap is adjustable among a plurality of predetermined positions with respect to the sensor housing; wherein said elongated strap comprises a plurality of holes; and wherein the sensor housing comprises a number of protrusions each being structured to be disposed in a corresponding one of said holes to removably secure said elongated strap in a desired one of said predetermined positions, wherein said plurality of holes comprises two parallel rows of holes in said elongated strap; and wherein said number of protrusions is a pair of pegs extending outwardly from the sensor housing, wherein the sensor housing further comprises a top, a bottom disposed opposite the top, a first side, a second side disposed opposite the first side, a first end, a second end disposed opposite the first end, and a slot disposed at or about the first end; wherein the bottom engages said bus bar; and wherein said elongated strap extends through said slot, around said bus bar, and over the top of the sensor housing, wherein said elongated strap includes a first end and a second end disposed opposite and distal from the first end; wherein the first end of said elongated strap includes an enlarged lip portion; and wherein said enlarged lip portion engages the sensor housing at or about said slot to prevent said elongated strap from undesirably detaching from the sensor housing, and wherein said elongated strap further includes a rib disposed proximate to but spaced a predetermined distance from said enlarged lip portion; and wherein said rib and said enlarged lip portion cooperate with the sensor housing to maintain said elongated strap in a desired position with respect to the sensor housing.

* * * * *